US009401496B2

(12) United States Patent
Chung et al.

(10) Patent No.: US 9,401,496 B2
(45) Date of Patent: Jul. 26, 2016

(54) ORGANIC LIGHT-EMITTING DISPLAY APPARATUS

(71) Applicant: Samsung Display Co., Ltd., Yongin, Gyeonggi-Do (KR)

(72) Inventors: Seung-Hwan Chung, Yongin (KR); Seul-Gi Kim, Yongin (KR); Jae-Joong Kwon, Yongin (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/336,368

(22) Filed: Jul. 21, 2014

(65) Prior Publication Data

US 2015/0115236 A1 Apr. 30, 2015

(30) Foreign Application Priority Data

Oct. 29, 2013 (KR) ........................ 10-2013-0129566

(51) Int. Cl.
*H01L 51/52* (2006.01)

(52) U.S. Cl.
CPC ........ *H01L 51/5268* (2013.01); *H01L 51/5265* (2013.01); *H01L 51/5275* (2013.01)

(58) Field of Classification Search
CPC ............ H01L 51/5262; H01L 51/5265; H01L 51/5268; H01L 2933/0091
See application file for complete search history.

(56) References Cited

U.S. PATENT DOCUMENTS

| | | | | |
|---|---|---|---|---|
| 2002/0042025 | A1 | 4/2002 | Tokai et al. | |
| 2006/0006795 | A1* | 1/2006 | Strip | 313/504 |
| 2006/0077122 | A1 | 4/2006 | Gally et al. | |
| 2009/0051277 | A1* | 2/2009 | Inoue et al. | 313/504 |
| 2011/0316026 | A1* | 12/2011 | Kim et al. | 257/98 |
| 2013/0050615 | A1* | 2/2013 | Rohrmoser | 349/64 |
| 2013/0069524 | A1 | 3/2013 | Takai et al. | |
| 2015/0077966 | A1* | 3/2015 | Bessho et al. | G02B 5/0242 362/19 |

FOREIGN PATENT DOCUMENTS

| | | | |
|---|---|---|---|
| JP | 08054503 | A | 2/1996 |
| JP | 2009272068 | A | 11/2009 |
| JP | 2012058420 | A | 3/2012 |
| KR | 1020110125406 | A | 11/2011 |
| KR | 1020130045267 | A | 5/2013 |

* cited by examiner

*Primary Examiner* — Whitney T Moore
(74) *Attorney, Agent, or Firm* — Cantor Colburn LLP

(57) ABSTRACT

An organic light-emitting display apparatus includes: a substrate; an organic light-emitting device including a first electrode disposed on the substrate, a second electrode disposed to face the first electrode, and an intermediate layer including an organic emission layer disposed between the first electrode and the second electrode; and a light scattering layer disposed on at least one of the first electrode and the second electrode disposed in a light emission direction, where the light scattering layer includes a plurality of barriers, and a light scattering pattern disposed at a side surface of each of the plurality of barriers.

20 Claims, 14 Drawing Sheets

ORGANIC LIGHT-EMITTING DISPLAY APPARATUS

This application claims priority to Korean Patent Application No. 10-2013-0129566, filed on Oct. 29, 2013, and all the benefits accruing therefrom under 35 U.S.C. §119, the content of which in its entirety is herein incorporated by reference.

BACKGROUND

1. Field

Exemplary embodiments of the invention relate to an organic light-emitting display apparatus.

2. Description of the Related Art

An organic light-emitting display apparatus is a self-luminous display apparatus that includes a plurality of organic light-emitting devices, each including a hole injection electrode, an electron injection electrode and an organic emission layer provided therebetween. In the organic light-emitting device, an exciton is generated when a hole injected from the hole injection electrode is recombined with an electron injected from the electron injection electrode in the organic emission layer. Light is emitted when the exciton falls from an excited state to a ground state.

Since the organic light-emitting display apparatus, which is a self-luminous display apparatus, does not use a separate light source, it may be driven by a low voltage and may be lightweight and slim. Also, since the self-luminous display apparatus generally has a wide viewing angle, a high contrast, and a fast response time, the self-luminous display apparatus is widely used in personal portable devices, such as MP3 players and mobile phones, and televisions ("TV"s).

SUMMARY

One or more embodiments of the invention relate to an organic light-emitting display apparatus.

Additional aspects will be set forth in part in the description which follows and, in part, will be apparent from the description, or may be learned by practice of the presented embodiments.

According to an exemplary embodiment of the invention, an organic light-emitting display apparatus includes: a substrate; an organic light-emitting device including a first electrode disposed on the substrate, a second electrode disposed to face the first electrode, and an intermediate layer including an organic emission layer disposed between the first electrode and the second electrode; and a light scattering layer disposed on at least one of the first electrode and the second electrode disposed in a light emission direction, where the light scattering layer includes a plurality of barriers, and a light scattering pattern disposed at a side surface of each of the plurality of barriers.

In an exemplary embodiment, each of the plurality of barriers may be disposed to extend substantially in a first direction, and the plurality of barriers may be disposed substantially parallel to each other.

In an exemplary embodiment, a top surface of each of the plurality of barriers may be substantially parallel to the substrate.

In an exemplary embodiment, the side surface of each of the plurality of barriers may be inclined at an angle in a range of about 45° to about 90° with respect to the substrate.

In an exemplary embodiment, a distance between the plurality of barriers may be in a range of about 1 micrometer (μm) to about 100 μm.

In an exemplary embodiment, distances between the plurality of barriers may be different from each other.

In an exemplary embodiment, the plurality of barriers may be divided into a first barrier portion and a second barrier portion which are disposed in a same plane, the barriers in the first barrier portion may be disposed to extend substantially in a first direction, and the barriers in the second barrier portion may be disposed to extend substantially in a second direction, which is perpendicular to the first direction.

In an exemplary embodiment, the light scattering layer may include a first light scattering layer and a second light scattering layer, which are sequentially disposed on at least one of the first electrode and the second electrode disposed in a light emission direction, the barriers in the first light scattering layer may extend substantially in a first direction, and the barriers in the second light scattering layer may extend substantially in a second direction, which is perpendicular to the first direction.

In an exemplary embodiment, the light scattering pattern may have a lenticular configuration.

In an exemplary embodiment, the light scattering pattern may include a plurality of hemispherical projections.

In an exemplary embodiment, a diameter of the plurality of projections may be in a range of about 1 μm to about 100 μm.

In an exemplary embodiment, the light scattering pattern may include recesses and protrusions, which are irregularly disposed.

In an exemplary embodiment, a surface roughness of the light scattering pattern may be in a range of about 0.1 μm to about 50 μm.

In an exemplary embodiment, the organic light-emitting display apparatus may further include a base film which supports the light scattering layer.

In an exemplary embodiment, the light scattering layer may be disposed on a light emission surface of the base film.

In an exemplary embodiment, the organic light-emitting display apparatus may further include an optical member disposed on a surface of the base film, which is opposite to the light emission surface of the base film.

In an exemplary embodiment, at least one of the first electrode and the second electrode may include a semitransparent layer.

In an exemplary embodiment, the intermediate layer may further include a cavity distance control layer configured to define a distance between the first electrode and the second electrode.

BRIEF DESCRIPTION OF THE DRAWINGS

These and/or other features of embodiments of the invention will become apparent and more readily appreciated from the following description of the embodiments, taken in conjunction with the accompanying drawings, in which.

DETAILED DESCRIPTION

Figure 1:
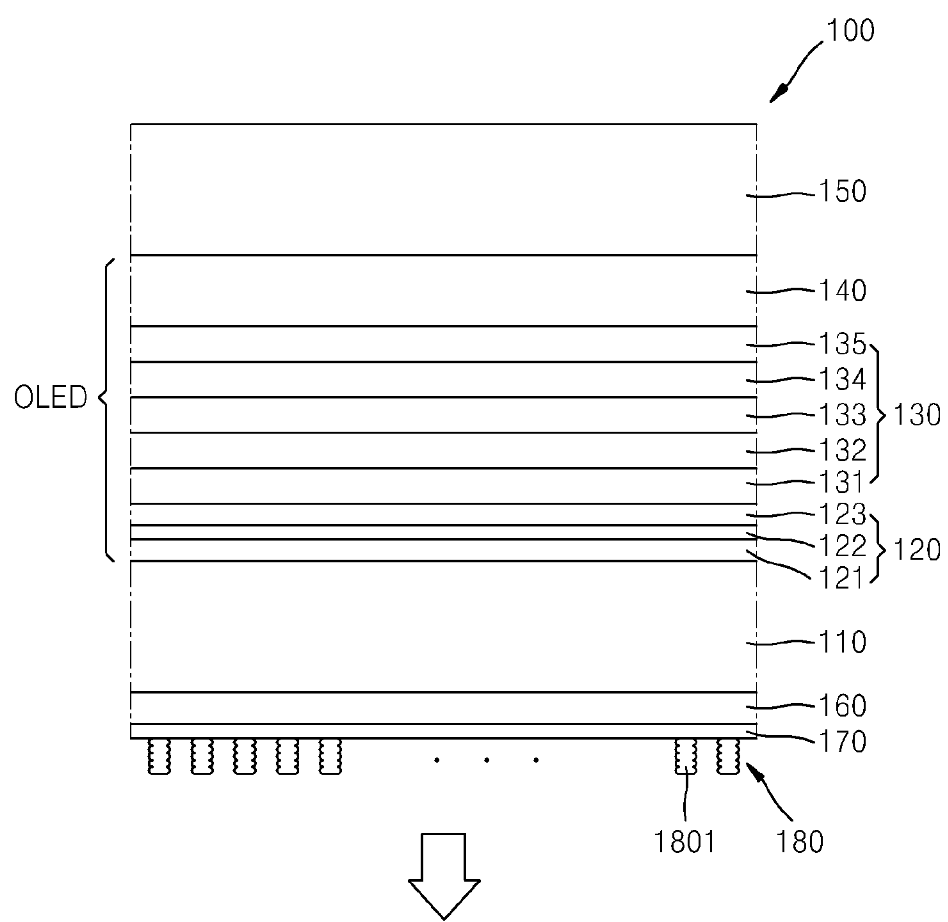
FIG. 1 is a schematic cross-sectional view of an exemplary embodiment of an organic light-emitting display apparatus, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the invention are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
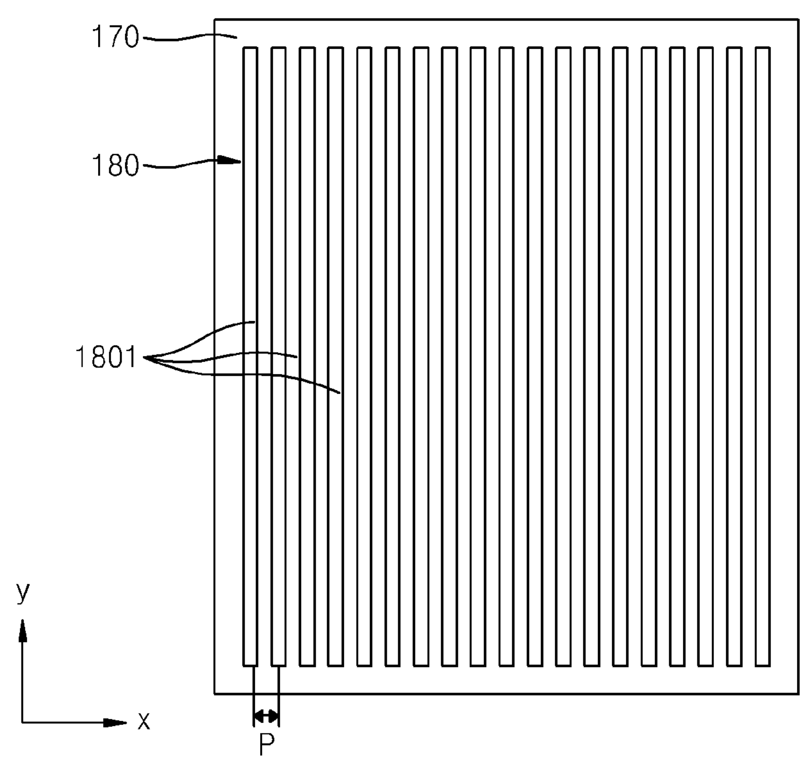
FIG. 2 is a schematic plan view of an exemplary embodiment of a light scattering layer in the organic light-emitting display apparatus of FIG. 1.
Figure 3:
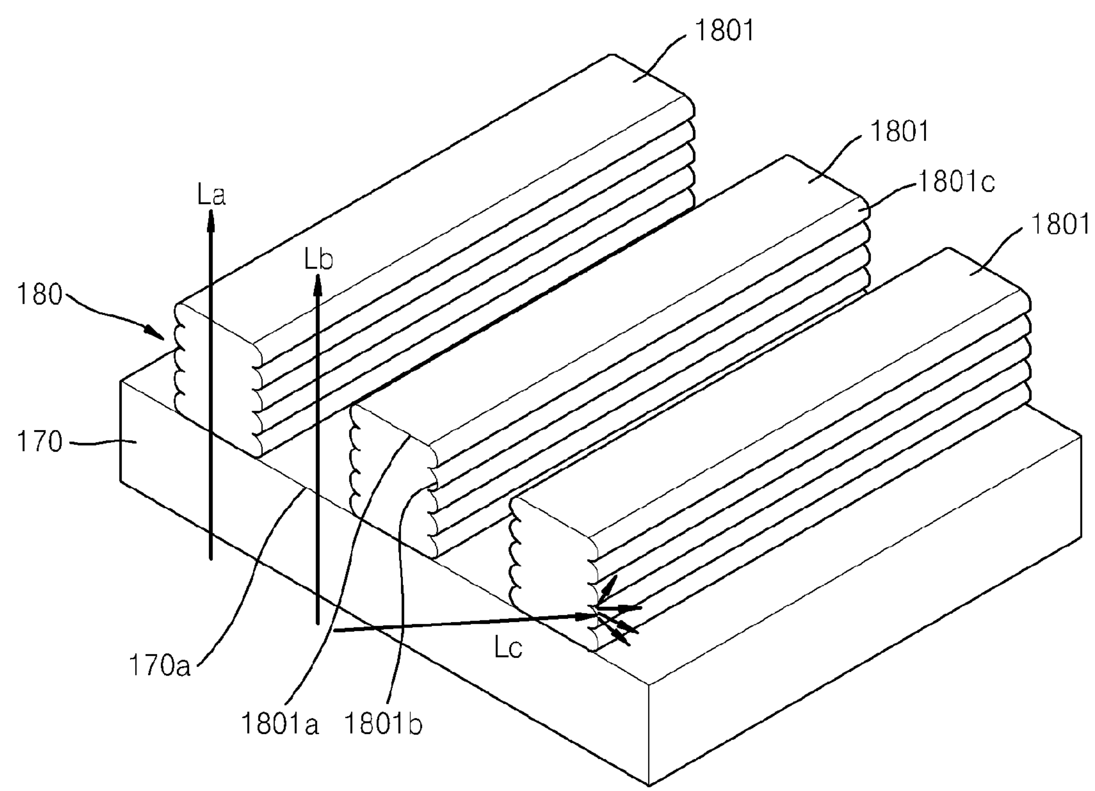
FIG. 3 is a schematic perspective view of an exemplary embodiment of the light scattering layer in the organic light-emitting display apparatus of FIG. 1.

FIG. 1 is a schematic cross-sectional view of an exemplary embodiment of an organic light-emitting display apparatus 100, according to the invention. FIG. 2 is a schematic plan view of an exemplary embodiment of a light scattering layer 180 in the organic light-emitting display apparatus 100 of FIG. 1. FIG. 3 is a schematic perspective view of an exemplary embodiment of the light scattering layer 180 in the organic light-emitting display apparatus 100 of FIG. 1.

Referring to FIGS. 1 to 3, an exemplary embodiment of the organic light-emitting display apparatus 100 includes a substrate 110, an organic light-emitting device OLED disposed on the substrate 110 and an encapsulation unit 150 disposed on the organic light-emitting device OLED. In such an embodiment, the organic light-emitting device OLED includes a first electrode 120, an intermediate layer 130 including an organic emission layer 133, and a second electrode 140.

The substrate 110 may include a transparent substrate, such as a glass substrate or a plastic substrate, for example.

The first electrode 120 of the organic light-emitting device OLED is disposed on the substrate 110. The first electrode 120 may include first and second transparent electrodes 121 and 123 including transparent conductive materials, and a semitransparent layer 122 configured to define a microcavity together with the second electrode 140.

In such an embodiment, the first electrode 120 may have a stack structure, in which the first transparent electrode 121, the semitransparent layer 122 and the second transparent electrode 123 are sequentially stacked. The first and second transparent electrodes 121 and 123 may include indium tin oxide ("ITO"), indium zinc oxide ("IZO"), zinc oxide (ZnO), indium oxide ($In_2O_3$), indium gallium oxide ("IGO"), aluminum zinc oxide ("AZO") or a combination thereof. The semitransparent layer 122 may include silver (Ag), magnesium (Mg), aluminum (Al), platinum (Pt), palladium (Pd), gold (Au), nickel (Ni), neodymium (Nd), iridium (Ir), chromium (Cr), calcium (Ca), ytterbium (Yb) or a combination thereof, and may have a thickness of several nanometers (nm) to tens of nanometers.

The intermediate layer 130 is disposed on the first electrode 120. The intermediate layer 130 includes the organic emission layer 133 and may further include at least one of a hole injection layer ("HIL") 131, a hole transport layer ("HTL") 132, an electron transport layer ("ETL") 134, and an electron injection layer ("EIL") 135. However, such an embodiment is not limited thereto, and the intermediate layer 130 includes the organic emission layer 133, as described above, and may further include other various functional layers.

The second electrode 140 is disposed on the intermediate layer 130. The second electrode 140 may be a reflective electrode, and may include Ag, Al, Mg, lithium (Li), Ca, copper (Cu), LiF/Ca, LiF/AI, MgAg, CaAg or a combination thereof.

The organic emission layer 133 emits red, green or blue light. Light emitted toward the second electrode 140 is reflected by the second electrode 140, penetrates the first electrode 120 that is a semitransparent electrode, and is emitted to the substrate 110.

In such an embodiment, the organic light-emitting display apparatus 100 may be a bottom emission type display apparatus that emits light to the substrate 110.

A path of the light emitted from the organic emission layer 133 will now be described in detail. In an exemplary embodiment, the light emitted from the organic emission layer 133 travels in all directions. Light traveling toward the second electrode 140 is reflected by the second electrode 140 and travels toward the first electrode 120.

A portion of light emitted from the organic emission layer 133 and travelling toward the first electrode 120 is reflected by the semitransparent layer 122 of the first electrode 120 and travels toward the second electrode 140, and another portion of the light travels toward the substrate 110 and is emitted to the outside.

In such an embodiment, a portion of the light emitted from the organic emission layer 133 reciprocates or confined between the first electrode 120 and the second electrode 140, and only light of a wavelength satisfying a constructive interference condition is amplified and emitted toward the substrate 110.

The semitransparent layer 122 of the first electrode 120 and the second electrode 140, which is a reflective electrode, collectively define a microcavity, thus increasing light efficiency and color purity.

The intermediate layer 130 of the organic light-emitting display apparatus 100 may include a cavity distance control layer configured to define a distance between the first electrode 120 and the second electrode 140. In an exemplary embodiment, the HTL 132 may function as the cavity distance control layer.

In such an embodiment, the organic emission layer 133 emits red, green and blue light having a relatively wide wavelength range, and the light is changed by the microcavity into light that has a narrow wavelength range and is emitted to the outside.

A wavelength of the light emitted to the outside is determined based on the distance between the first electrode 120 and the second electrode 140. Thus, in an exemplary embodiment, by controlling the distance between the first electrode 120 and the second electrode 140 using the cavity distance control layer, light of a predetermined wavelength may be emitted to the outside.

In an exemplary embodiment, light of a wavelength corresponding to a predetermined cavity distance is emitted to the normal direction of the organic light-emitting display apparatus 100. However, in such an embodiment, light emitted to the oblique direction with respect to the normal direction of the organic light-emitting display apparatus 100 reciprocates along a distance longer than the minimum distance between the first electrode 120 and the second electrode 140, thus a constructive interference may occur.

When a cavity distance of the light emitted to the oblique direction with respect to the normal direction becomes different from a cavity distance of the light emitted to the normal direction, a wavelength of the light emitted to the oblique direction may become different from a wavelength of the light emitted to the normal direction, such that a color shift may occur.

In an exemplary embodiment, the organic light-emitting display apparatus 100 includes the light scattering layer 180 disposed on a light emission surface of the substrate 110. Light incident to the oblique direction of the light scattering layer 180 may be scattered by the light scattering layer 180 and emitted in several directions. A configuration of the light scattering layer 180 will be described later in detail.

An optical member 160 and a base film 170 may be disposed between the substrate 110 and the light scattering layer 180. The optical member 160 may include a phase retarder and a polarizer, and may function to effectively prevent light that is incident on the organic light-emitting display apparatus 100 from the outside from being reflected, and substantially improve the visibility and contrast of the organic light-emitting display apparatus 100. The base film 170 may protect the polarizer of the optical member 160 and support the light scattering layer 180.

In an exemplary embodiment, a plurality of barriers 1801 in the light scattering layer 180 may be disposed on the base film 170, and the base film 170 may include cellulose triacetate ("TAC") or polyethyleneterephthalate ("PET"), for example.

The encapsulation layer 150 is disposed on the second electrode 140. The encapsulation unit 150 seals the organic light-emitting device OLED. The encapsulation unit 150 may be a glass substrate, a plastic substrate or a metal film, for example. In an exemplary embodiment, an encapsulation thin film may include an organic insulating film and an inorganic insulating film, which are alternately disposed therein.

Referring to FIG. 2, in an exemplary embodiment, the light scattering layer 180 includes a plurality of barriers 1801. Each of the plurality of barriers 1801 may be disposed to extend substantially in a y-axis direction, and the plurality of barriers 1801 may be disposed substantially parallel to each other. The y-axis direction may be a long-side direction of the organic light-emitting display apparatus 100.

In an exemplary embodiment, where the barrier 1801 is disposed to extend substantially in the long-side direction of the organic light-emitting display apparatus 100, a color shift caused by a viewing angle in a horizontal direction, that is, a short-side direction of the organic light-emitting display apparatus 100, may be effectively reduced.

The plurality of barriers 1801 may be disposed at a regular or constant interval P on the base film 170, and the interval P may be in a range of about 1 micrometer (μm) to about 100 μm. When the interval P is less than about 1 μm, a manufacturing yield of the barrier 1801 may be reduced. When the interval P is greater than about 100 μm, a moire phenomenon may occur due to an interference with a pixel structure.

Referring to FIG. 3, in an exemplary embodiment, the light scattering layer 180 including the plurality of barriers 1801 is disposed on a top surface 170*a* of the base film 170, through which light is emitted, and a light scattering pattern 1801*c* is disposed at a side surface 1801*b* of each barrier 1801. The light scattering pattern 1801*c* may have a lenticular configuration in which a plurality of semicylindrical convex portions is consecutively disposed.

A top surface 1801*a* of the barrier 1801 may be substantially parallel to the substrate 110 (see FIG. 1), that is, an image implementation surface of the organic light-emitting display apparatus 100, and the top surface 170*a* of the base film 170, on which the light scattering layer 180 is disposed, may also be substantially parallel to the substrate 110.

In an exemplary embodiment, as shown in FIG. 3, lights La and Lb emitted from the organic emission layer 133 (see FIG. 1) to the front surface of the organic light-emitting display apparatus 100 are emitted to the outside after penetrating a region in which the barrier 1801 is not disposed, among the top surface 1801*a* of the barrier 1801 or the top surface 170*a* of the base film 170.

In such an embodiment, the lights La and Lb emitted to the normal direction of the organic light-emitting display apparatus 100 may be emitted to the outside without being scattered.

However, light Lc emitted from the organic emission layer 133 (see FIG. 1) to the oblique direction with respect to the normal direction is incident on the side surface 1801*b* of the barrier 1801, and may be scattered in several directions by the light scattering pattern 1801*c* disposed at the side surface 1801*b*.

Thus, in an exemplary embodiment of the organic light-emitting display apparatus 100, the light emitted to the oblique direction is scattered and emitted in several directions, such that a color shift caused by a viewing angle, that is, the dependence of the wavelength of the emitted light on an angle, may be substantially reduced.

FIGS. 4 to 7 are schematic plan views of alternative exemplary embodiments of the light scattering layer, according to the invention.

Figure 4:
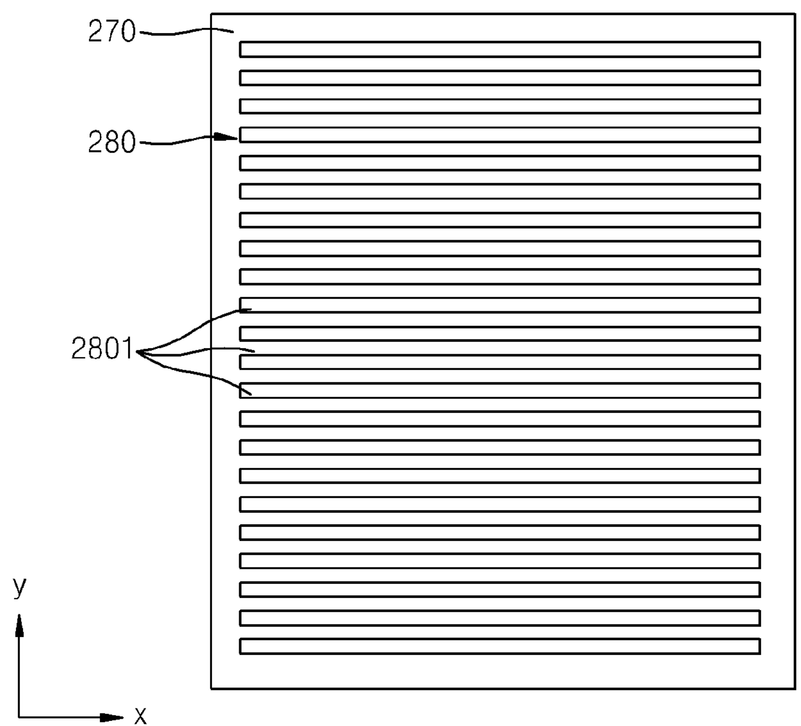
FIGS. 4 to 7 are schematic plan views of alternative exemplary embodiments of the light scattering layer, according to the invention.

Referring to FIG. 4, in an alternative exemplary embodiment, a light scattering layer 280 including a plurality of barriers 2801 is disposed on a base film 270, and each of the plurality of barriers 2801 may be disposed to extend substantially in an x-axis direction. The x-axis direction may be the short-side direction of the organic light-emitting display apparatus 100.

In such an embodiment, where the barrier 2801 is disposed to extend substantially in the short-side direction of the organic light-emitting display apparatus 100, a color shift caused by a viewing angle in a vertical direction, that is, the long-side direction of the organic light-emitting display apparatus 100, may be effectively reduced.

Figure 5:
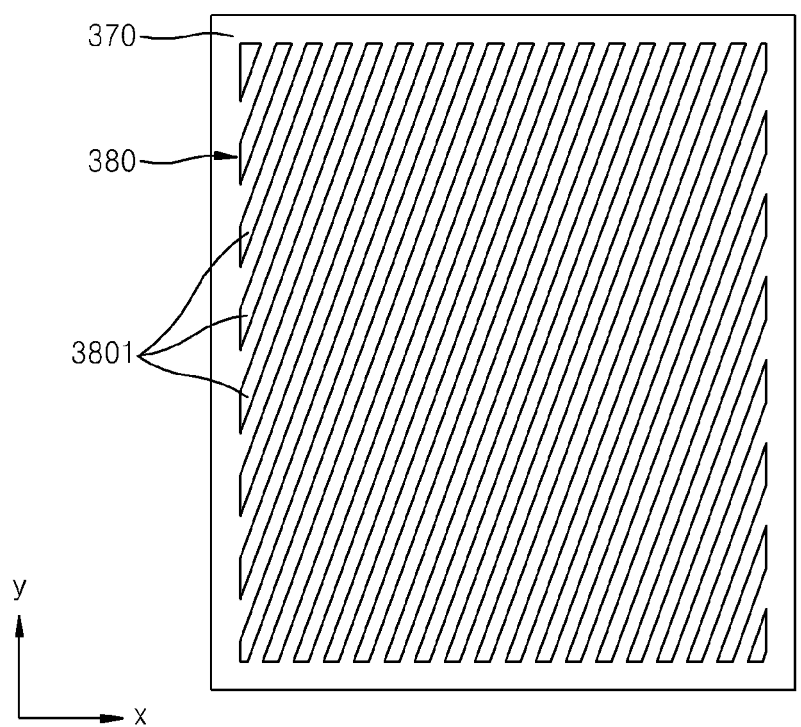

Referring to FIG. 5, in another alternative exemplary embodiment, a light scattering layer 380 including a plurality of barriers 3801 is disposed on a base film 370, and each of the plurality of barriers 3801 may be disposed to extend substantially in a direction inclined at an angle with respect to the x-axis direction. In such an embodiment, the angle may be greater than about zero degree)(0° and less than about 90°.

In such an embodiment, the plurality of barriers 3801 are disposed at a constant or regular interval and substantially parallel to each other, a moire phenomenon may occur due to an overlap between the pattern of the barrier 3801 and the disposition pattern of pixel regions in the organic light-emitting display apparatus 100.

In such an embodiment, as illustrated in FIG. 5, the disposition direction of the plurality of barriers 3801 is not parallel to the long-side direction or the short-side direction of the organic light-emitting display apparatus 100, but is inclined at an angle with respect to the long-side direction or the short-side direction such that a moire phenomenon may be effectively prevented from occurring on the long side (or short side).

Figure 6:
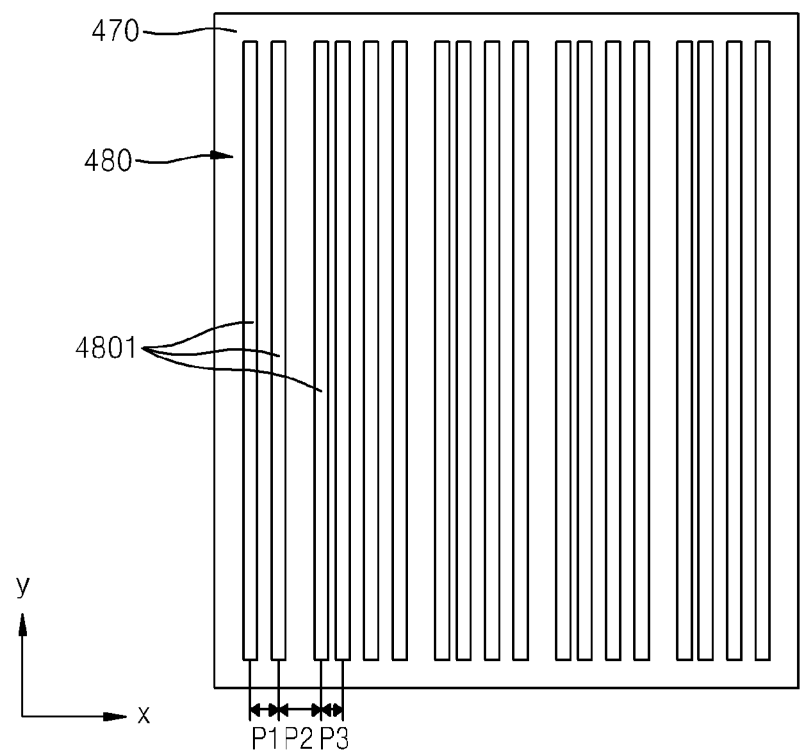

Referring to FIG. 6, in another alternative exemplary embodiment, a light scattering layer 480 including a plurality of barriers 4801 is disposed on a base film 470, and each of the plurality of barriers 4801 may be disposed to extend substantially in the y-axis direction.

In such an embodiment, the plurality of barriers 4801 may be disposed at different intervals P1, P2 and P3 on the base film 470. In such an embodiment, the pattern of the plurality of barriers 4801 is not uniformly disposed, such that the above-described moire phenomenon may be effectively prevented.

Figure 7:
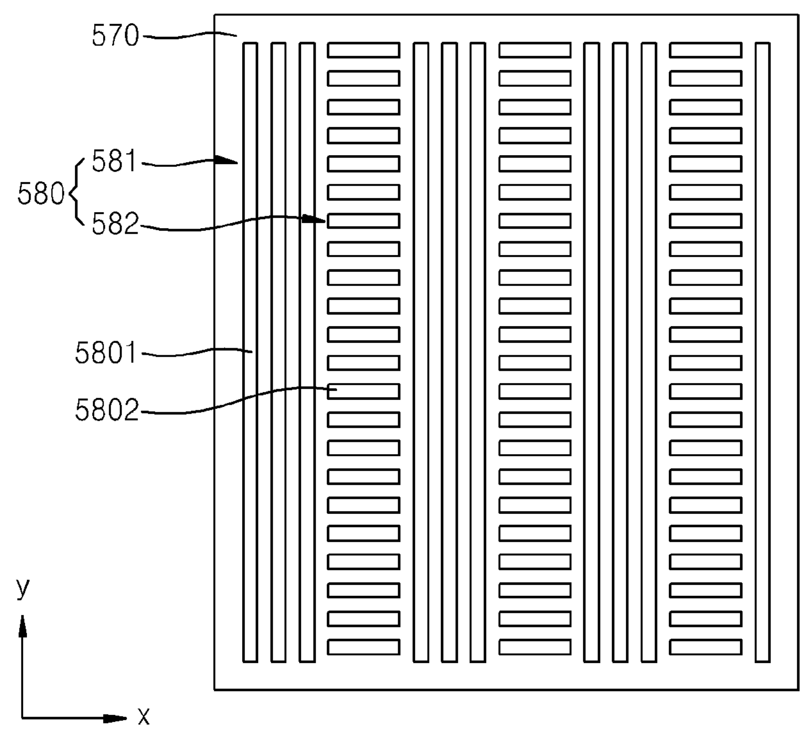

Referring to FIG. 7, in another alternative exemplary embodiment, a light scattering layer 580 is disposed on a base film 570, and may include a first barrier portion 581 and a second barrier portion 582. Each of a plurality of barriers 5801 in the first barrier portion 581 may be disposed to extend substantially in the y-axis direction, and each of a plurality of barriers 5802 in the second barrier portion 582 may be disposed to extend substantially in the x-axis direction.

Accordingly, in such an embodiment, a color shift caused by the horizontal and vertical viewing angles of the organic light-emitting display apparatus 100 may be effectively reduced.

In an exemplary embodiment, as shown in FIG. 7, the plurality of barriers 5801 in the first barrier portion 581 may be disposed to extend substantially in the y-axis direction and the plurality of barriers 5802 in the second barrier portion 582 may be disposed to extend substantially in the x-axis direction, the invention is not limited thereto. In an alternative exemplary embodiment, the x-axis direction and the y-axis direction are not limited to the short-side direction and the long-side direction of the organic light-emitting display apparatus 100, but may be any directions that are substantially perpendicular to each other.

Figure 8:
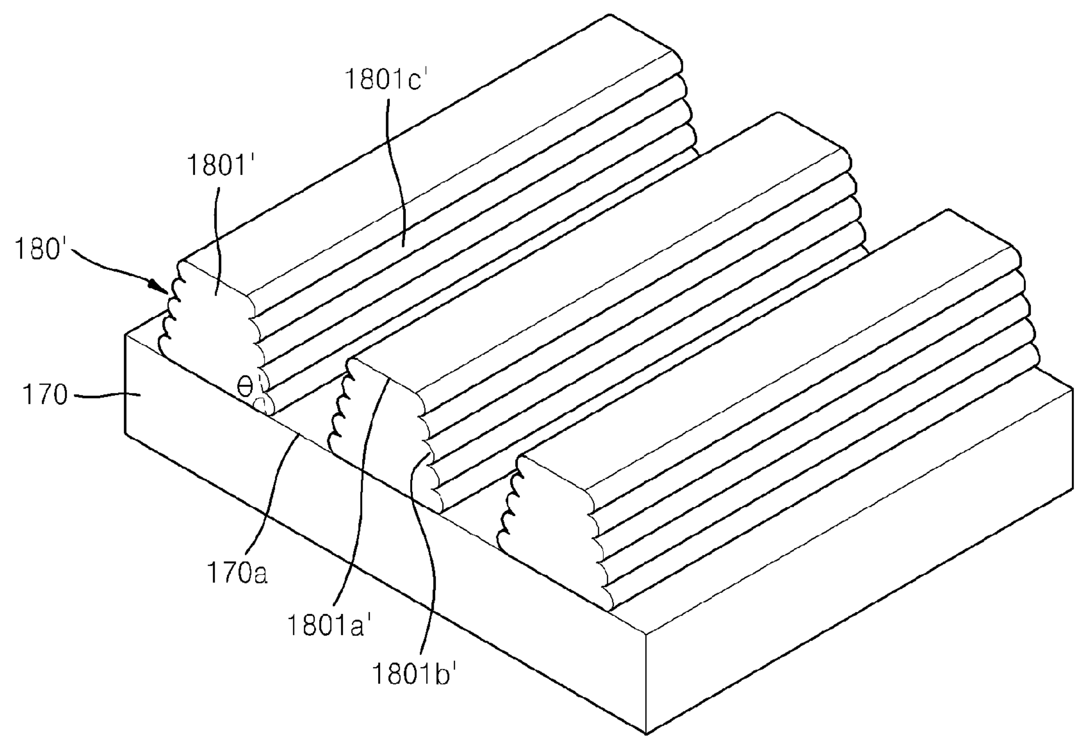
FIGS. 8 to 10 are schematic perspective views of portions of alternative exemplary embodiments of the light scattering layer, according to the invention.
Figure 9:
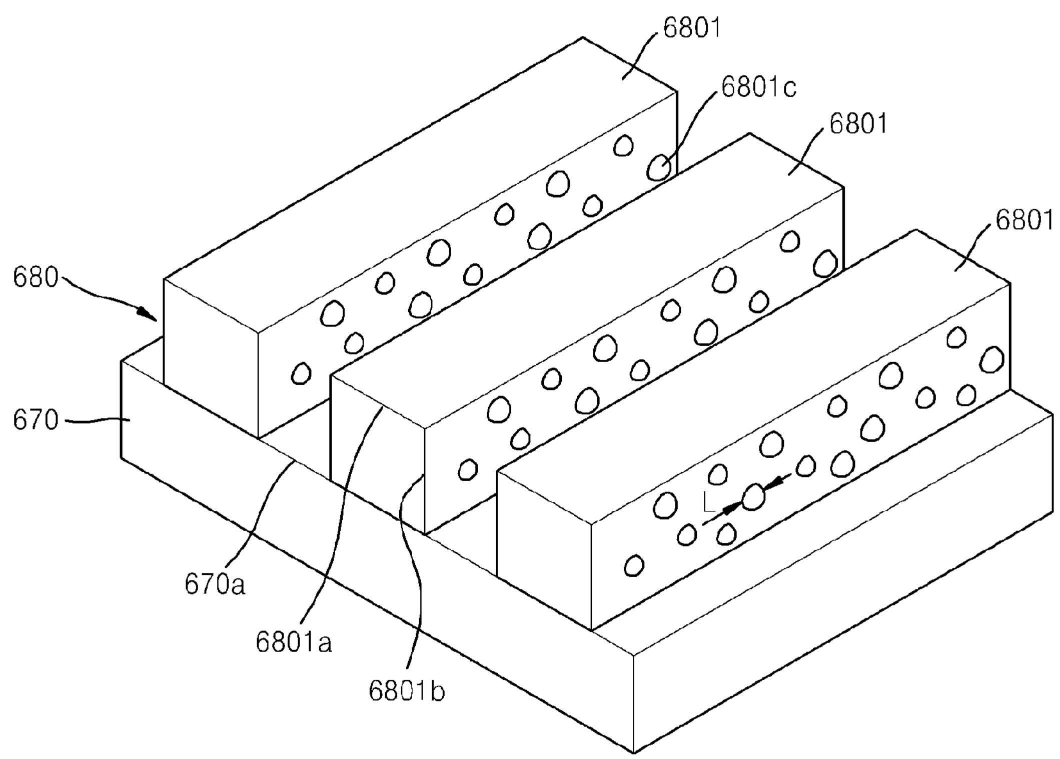
Figure 10:
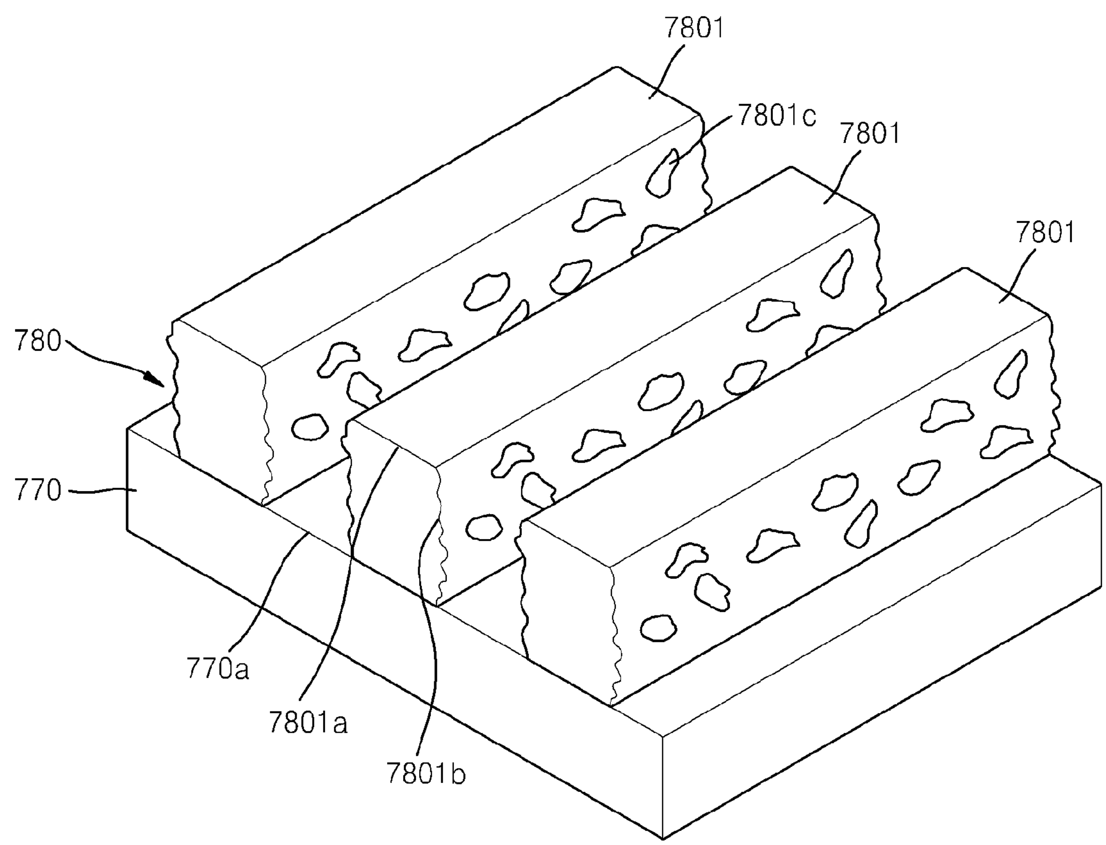

FIGS. 8 to 10 are schematic perspective views of portions of alternative exemplary embodiments of the light scattering layer, according to the invention.

Referring to FIG. 8, in an alternative exemplary embodiment, a light scattering layer 180' including a plurality of barriers 1801' is disposed on the top surface 170*a* of the base film 170, through which light is emitted, and a light scattering pattern 1801*c*' is disposed at a side surface 1801*b*' of each barrier 1801'. The light scattering pattern 1801*c*' may have a lenticular configuration in which a plurality of semicylindrical convex portions are consecutively disposed. In such an embodiment, the semicylindrical convex portions may extend in a direction substantially parallel to the extending direction of the barriers 1801'.

The side surface 1801*b*' of each of the plurality of barrier 1801' may be inclined at an angle θ with respect to the substrate 110 (see FIG. 1), that is, an image display surface of the organic light-emitting display apparatus 100, and the angle θ may be in a range of about 45° to about 90°.

When the angle θ is less than about 45°, a portion of the light emitted to the normal direction is scattered and thus the front luminance may be reduced. When the angle θ is greater than about 90°, a shaping processing may be difficult.

A top surface 1801*a*' of the barrier 1801' and the top surface 170*a* of the base film 170, on which the light scattering layer 180' is disposed, may be substantially parallel to the image display surface of the organic light-emitting display apparatus 100.

Referring to FIG. 9, in another alternative exemplary embodiment, a light scattering layer 680 including a plurality of barriers 6801 is disposed on a top surface 670*a* of a base film 670, through which light is emitted, and a light scattering pattern 6801*c* is disposed at a side surface 6801*b* of each barrier 6801. The light scattering pattern 6801*c* may include a plurality of hemispheric projections.

A diameter L of each of the plurality of hemispheric projections may be in a range of about 1 μm to about 100 μm. When the diameter L is less than about 1 μm, a scattering effect may be reduced and thus a color shift reducing effect may be reduced. When the diameter L is greater than about 100 μm, a projection shape may be viewed as it is.

A top surface 6801*a* of the barrier 6801 and the top surface 670*a* of the base film 670, on which the light scattering layer 680 is disposed, may be substantially parallel to the image display surface of the organic light-emitting display apparatus 100.

Referring to FIG. 10, in another alternative exemplary embodiment, a light scattering layer 780 including a plurality of barriers 7801 is disposed on a top surface 770*a* of a base film 770, through which light is emitted, and a light scattering pattern 7801*c* is disposed at a side surface 7801*b* of each barrier 7801. The light scattering pattern 7801*c* may include recesses and protrusions that are irregularly or non-uniformly disposed.

A surface roughness Ra of the light scattering pattern 7801*c* may be about in a range of 0.1 μm to about 50 μm. When the surface roughness Ra is less than about 0.1 μm, a scattering effect may be reduced and thus a color shift reducing effect may be reduced. When the surface roughness Ra is greater than about 50 μm, the light scattering pattern 7801*c* may be viewed as it is.

The surface roughness Ra refers to an arithmetical average roughness, and represents an average value of the distances of the recesses and the protrusions from an average line.

A top surface 7801*a* of the barrier 7801 and the top surface 770*a* of the base film 770, on which the light scattering layer 780 is disposed, may be substantially parallel to the image display surface of the organic light-emitting display apparatus 100.

Figure 11:
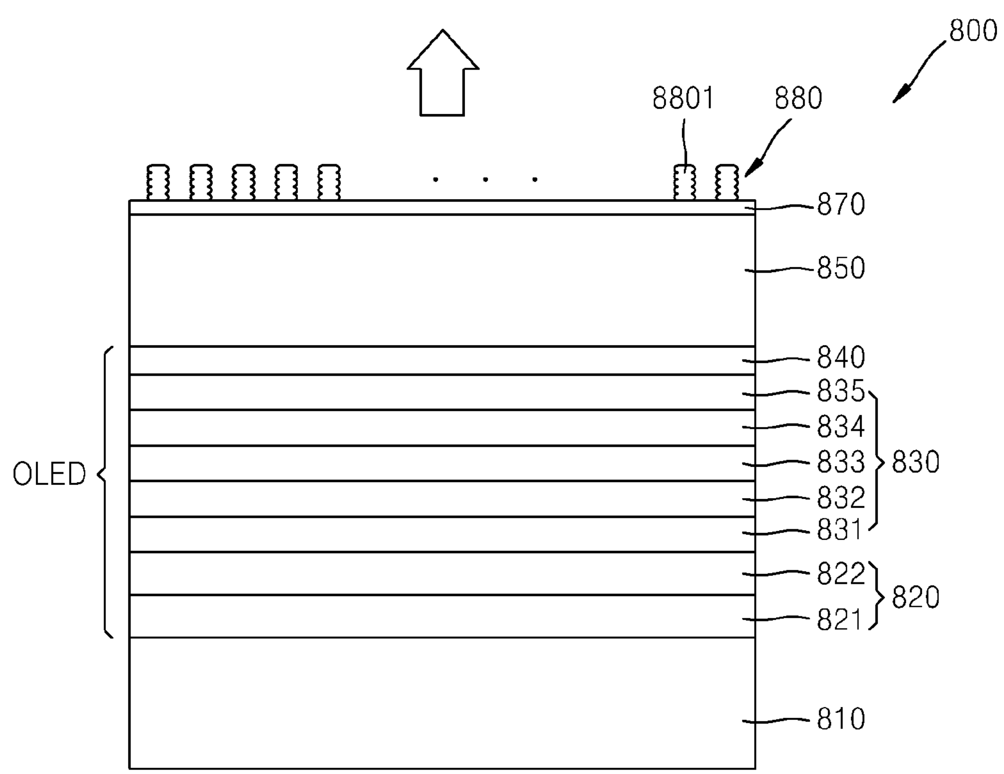
FIG. 11 is a schematic cross-sectional view of an alternative exemplary embodiment of an organic light-emitting display apparatus, according to the invention.

FIG. 11 is a schematic cross-sectional view of an alternative exemplary embodiment of an organic light-emitting display apparatus 800, according to the invention.

Referring to FIG. 1, in an exemplary embodiment, the organic light-emitting display apparatus 800 includes: a substrate 810; an organic light-emitting device OLED disposed on the substrate 810 and including a first electrode 820, an intermediate layer 830 including an organic emission layer 833, and a second electrode 840; and an encapsulation unit 850 disposed on the organic light-emitting device OLED.

The substrate 810 may be a glass substrate, a metal substrate, or a plastic substrate, for example. The first electrode 820 of the organic light-emitting device OLED is disposed on the substrate 810. The first electrode 820 may be a reflective electrode. The first electrode 820 may include a reflective electrode 821 including Ag, Mg, Al, Pt, Pd, Au, Ni, Nd, Ir, Cr, or a combination thereof, and a transparent or semitransparent electrode layer 822 disposed on the reflective electrode 821.

The intermediate layer 830 is disposed on the first electrode 820. The intermediate layer 830 includes the organic emission layer 833 and may further include at least one of a HIL 831, a HTL 832, an ETL 834, and an EIL 835. However, the embodiment is not limited thereto, and the intermediate layer 830 includes the organic emission layer 833 and may further include other various functional layers. The HTL 832 may function as a cavity distance control layer.

The second electrode 840 is disposed on the intermediate layer 830. The second electrode 840 may be a semitransparent electrode, and may include Ag, Al, Mg, Li, Ca, Cu, LiF/Ca, LiF/AI, MgAg, CaAg, or a combination thereof. The second electrode 840 may be formed to have a thickness of several nanometers to tens of nanometers.

The organic emission layer 833 emits red, green or blue light. Light emitted from the organic emission layer 833 toward the first electrode 820 is reflected by the first electrode 820, penetrates the second electrode 840 that is a semitransparent electrode, and is emitted toward the encapsulation unit 850.

In such an embodiment, the organic light-emitting display apparatus 800 may be a top emission type display apparatus that emits light to the encapsulation unit 850.

In such an embodiment, the organic light-emitting display apparatus 800 may include a microcavity that is defined by the first electrode 820 and the second electrode 840. A path of the light emitted from the organic emission layer 833 is similar to the path of the light emitted from the organic light-emitting display apparatus 100 of FIG. 1, and thus any repetitive detailed description thereof will be omitted.

The light emitted from the organic emission layer 833 is emitted toward the encapsulation unit 850, and a wavelength of light emitted to the normal direction of the organic light-emitting display apparatus 800 and a wavelength of light emitted to the oblique direction with respect to the normal direction may be different due to a cavity distance difference.

A light scattering layer 880 including a plurality of barriers 8801 may be disposed on the encapsulation unit 850. A base film 870 may be disposed between the encapsulation unit 850 and the light scattering layer 880 to support the light scattering layer 880. In such an embodiment, an optical member (not shown) may be further disposed under the base film 870 to effectively prevent external light reflection.

The configuration of the light scattering layer 880 is substantially the same as the above-described configuration, and thus any repetitive detailed description thereof will be omitted.

In an exemplary embodiment of the organic light-emitting display apparatus 800, the light scattering layer 880 is disposed on the encapsulation unit 850 in the direction of light emitted from the organic emission layer 833 to the outside, such that a color shift caused by a viewing angle, that is, the dependence of the wavelength of the emitted light on an angle, may be substantially reduced.

Figure 12:
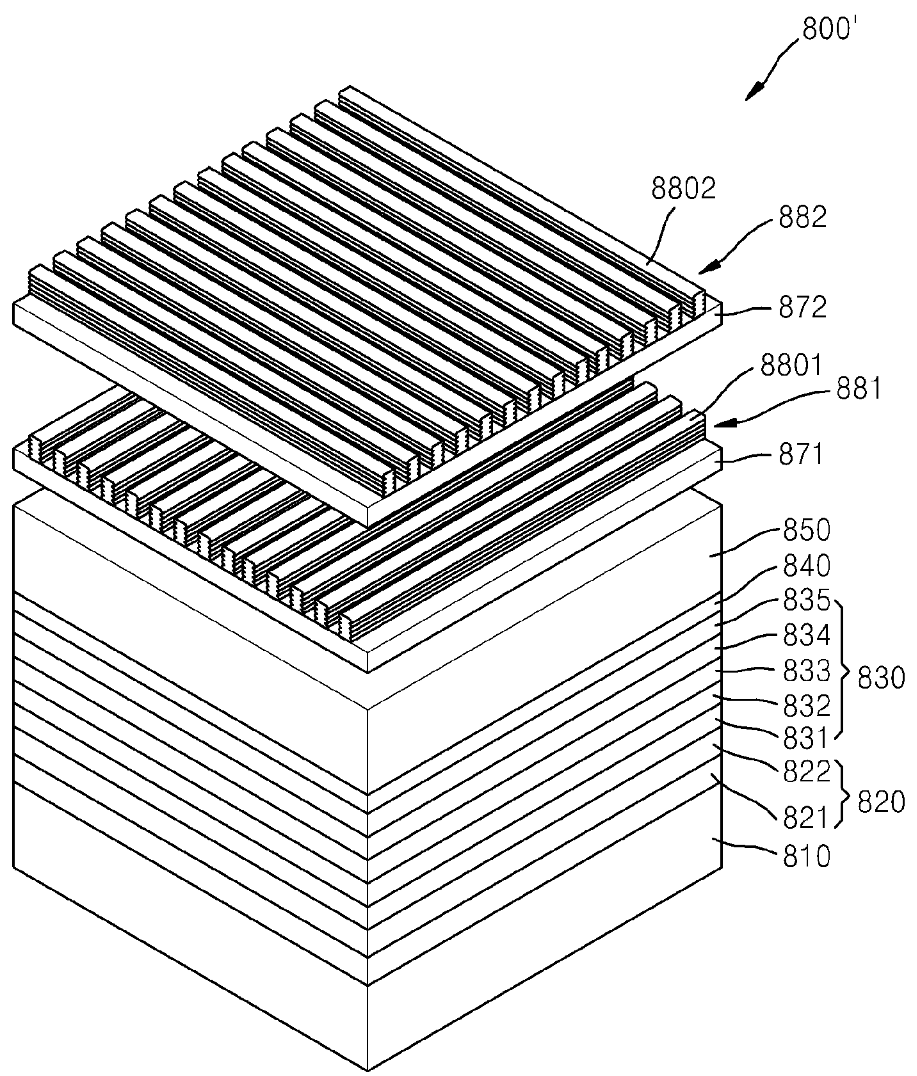
FIG. 12 is a schematic exploded perspective view of another alternative exemplary embodiment of an organic light-emitting display apparatus, according to the invention.

FIG. 12 is a schematic exploded perspective view of another alternative exemplary embodiment of an organic light-emitting display apparatus 800', according to the invention.

The organic light-emitting display apparatus 800' shown in FIG. 12 is substantially the same as the organic light-emitting display apparatus 800 of FIG. 11 except for the light scattering layer 880.

In an exemplary embodiment, as shown in FIG. 12, light emitted from an organic emission layer 833 included in the organic light-emitting display apparatus 800' is emitted toward an encapsulation unit 850, and a first light scattering layer 881 and a second light scattering layer 882 may be disposed on the encapsulation unit 850.

The first light scattering layer 881 may include a plurality of barriers 8801 disposed to extend substantially in a first direction, and the second light scattering layer 882 may include a plurality of barriers 8802 disposed to extend substantially in a second direction that is perpendicular to the first direction. A first base film 871 may be disposed between the encapsulation unit 850 and the first light scattering layer 881 to support the first light scattering layer 881, and a second base film 872 may be disposed between the first light scattering layer 881 and the second light scattering layer 882 to support the second light scattering layer 882.

In such an embodiment, the organic light-emitting display apparatus 800' may include a plurality of light scattering layers 881 and 882, thus effectively reducing a color shift caused by viewing angles in several directions of the organic light-emitting display apparatus 800', for example, in the horizontal direction and the vertical direction.

Figure 13:
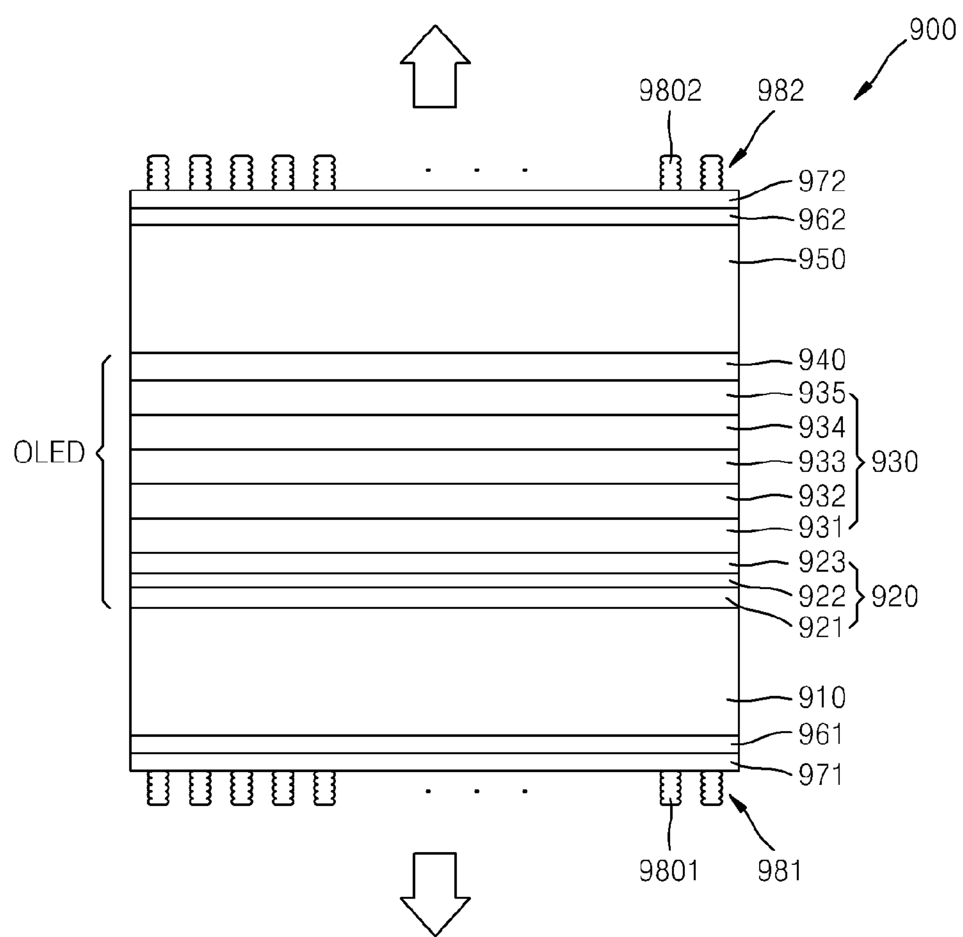
FIGS. 13 and 14 are schematic cross-sectional views of alternative exemplary embodiments of an organic light-emitting display apparatus, according to the invention.
Figure 14:
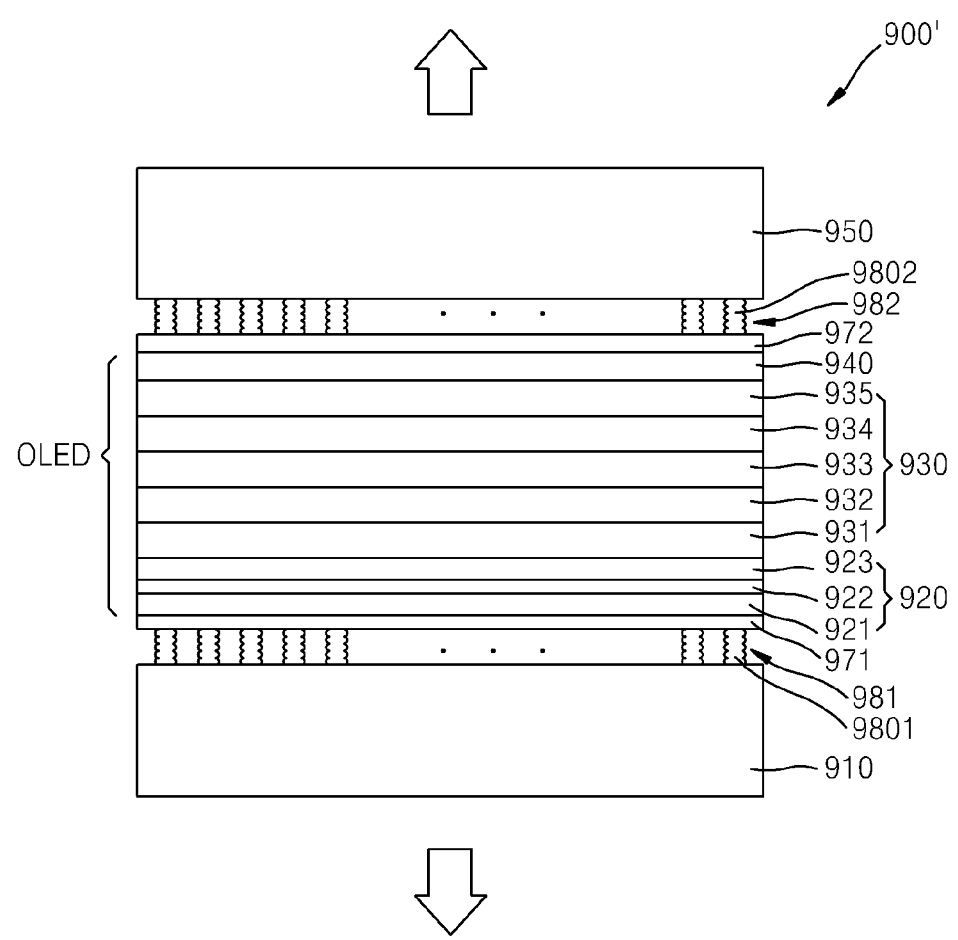

FIGS. 13 and 14 are schematic cross-sectional views of alternative exemplary embodiment of an organic light-emitting display apparatus, according to the invention.

Referring to FIG. 13, in an alternative exemplary embodiment, an organic light-emitting display apparatus 900 includes: a substrate 910; an organic light-emitting device OLED disposed on the substrate 910 and including a first electrode 920, an intermediate layer 930 including an organic emission layer 933, and a second electrode 940; and an encapsulation unit 950 disposed on the organic light-emitting device OLED.

The substrate 910 may be a glass substrate or a plastic substrate, for example. The first electrode 920 of the organic light-emitting device OLED is disposed on the substrate 910. The first electrode 920 may include: first and second transparent electrodes 921 and 923 including transparent conductive materials; and a semitransparent layer 922 configured to define a microcavity together with the second electrode 940.

In such an embodiment, the first electrode 920 may have a structure in which the first transparent electrode 921, the semitransparent layer 922 and the second transparent electrode 923 are sequentially stacked.

The intermediate layer 930 is disposed on the first electrode 920. The intermediate layer 930 includes the organic emission layer 933 and may further include at least one of a HIL 931, a HTL 932, an ETL 934, and an EIL 935. However, the embodiment is not limited thereto, and the intermediate layer 930 includes the organic emission layer 933 and may further include other various functional layers. In such an embodiment, the HTL 932 may function as a cavity distance control layer.

The second electrode 940 is disposed on the intermediate layer 930. The second electrode 940 may be a semitransparent electrode, and may include Ag, Al, Mg, Li, Ca, Cu, LiF/Ca, LiF/AI, MgAg, CaAg or a combination thereof. The second electrode 840 may have a thickness of several nanometers to tens of nanometers.

The organic emission layer 933 emits red, green or blue light, and the light emitted from the organic emission layer 922 may be emitted toward the substrate 910 and toward the encapsulation unit 950 after penetrating the first electrode 920 and the second electrode 940.

In such an embodiment, the organic light-emitting display apparatus 900 may be a both-side emission type display apparatus that emits light to the substrate 110 and to the encapsulation unit 950.

The organic light-emitting display apparatus 900 may include a microcavity that is defined by the first electrode 920 and the second electrode 940.

The light emitted from the organic emission layer 933 is emitted toward the substrate 910 and toward the encapsulation unit 950, and a wavelength of light emitted to the normal direction of organic light-emitting display apparatus 900 and a wavelength of light emitted to the oblique direction with respect to the normal direction may be different due to a cavity distance difference, that is, a travel distance in the cavity.

A first light scattering layer 981 including a plurality of barriers 9801 and a second light scattering layer 982 including a plurality of barriers 9802 may be disposed at the outer surfaces of the substrate 910 and the encapsulation unit 950, respectively, and a color shift caused by viewing angles may be reduced by the first light scattering layer 981 and the second light scattering layer 982.

Optical members 961 and 962, which effectively prevent external light reflection, and first and second base films 971 and 972, which support the first and second light scattering layers 981 and 982, may be disposed between the substrate 910 and the first light scattering layer 981 and between the encapsulation unit 950 and the second light scattering layer 982.

The organic light-emitting display apparatus 900' shown in FIG. 14 is substantially the same as the organic light-emitting display apparatus 900 of FIG. 13 except for the positions of the first and second light scattering layers 981 and 982.

In an exemplary embodiment of the organic light emitting display device 900', as shown in FIG. 14, a first light scattering layer 981 and a first base film 971 supporting the first light scattering layer 981 may be disposed between a substrate 910 and a first electrode 920, and a second light scattering layer 982 and a second base film 972 that support the second light scattering layer 982 may be disposed between an encapsulation layer 950 and a second electrode 940.

In such an embodiment, the positions of the first and second light scattering layers 981 and 982 are not limited to the positions described above, and the first and second light scattering layers 981 and 982 may be disposed at any positions on at least one of the first electrode 920 and the second electrode 940 disposed in the light emission direction.

Figure 15:
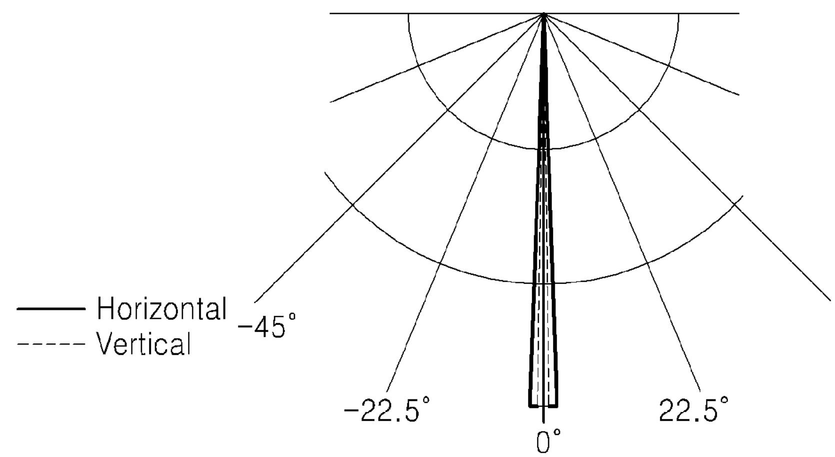
FIG. 15 is a graph illustrating angle-dependent intensities of light that is incident to the normal direction of and penetrates the light scattering layer of FIG. 3.
Figure 16A:
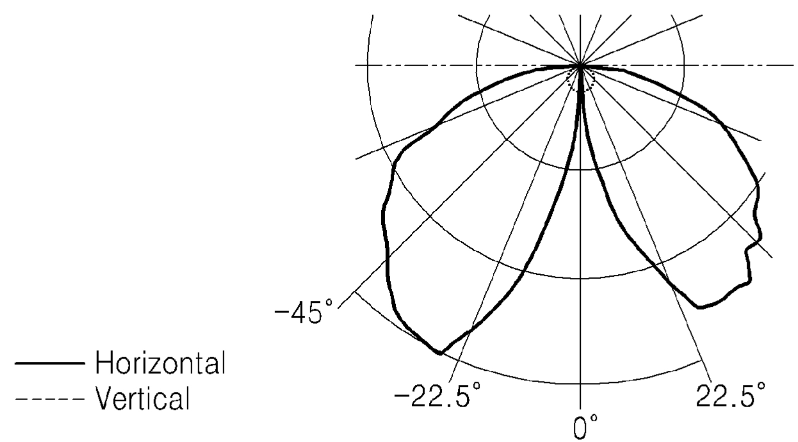
FIGS. 16A to 16E are graphs illustrating angle-dependent intensities of light that is incident to the oblique direction with respect to the normal direction of and penetrates the light scattering layer of FIG. 3, which includes barriers having different aspect ratios.
Figure 16B:
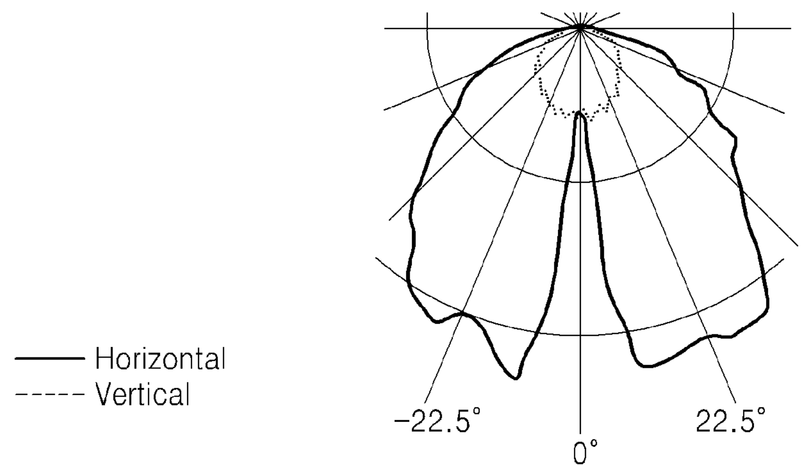
Figure 16C:
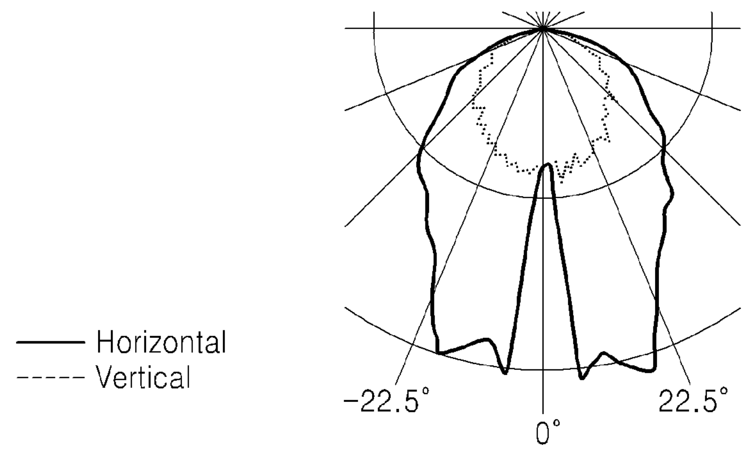
Figure 16D:
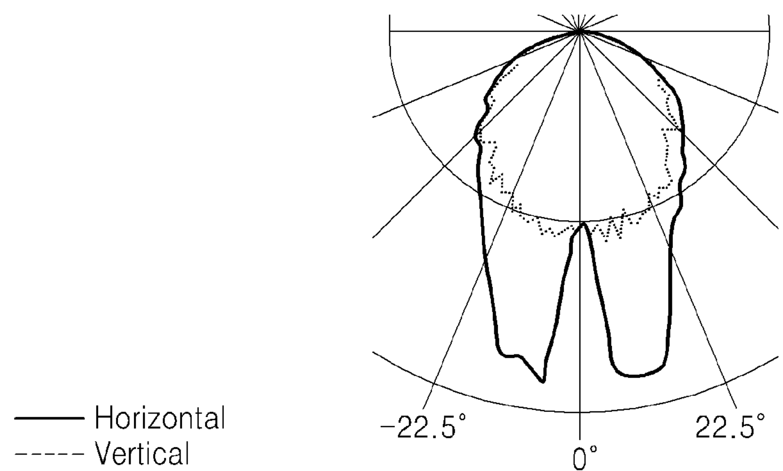
Figure 16E:
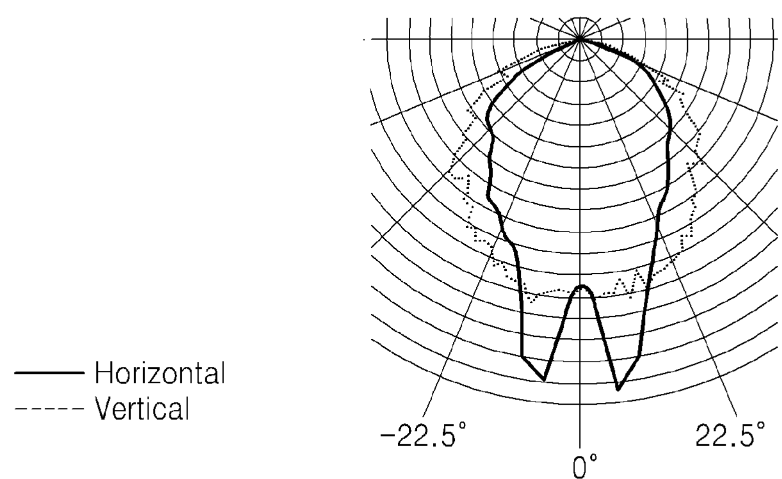

FIG. 15 is a graph illustrating angle-dependent intensities of light that is incident to the normal direction of and penetrates the light scattering layer 180 of FIG. 3.

The graph of FIG. 15 is a polar-coordinate graph. An angle illustrated in the graph represents an inclination degree of a viewing angle with respect to the normal direction along the horizontal direction of the organic light-emitting display apparatus 100 (see FIG. 1), and a distance from a center of a circle represents a luminescence intensity. A solid line and a dotted line of the graph represent lights emitted from the organic light-emitting display apparatus 100 along the horizontal direction and the vertical direction, respectively.

Referring to FIGS. 3 and 15, lights incident to the normal direction)(0° of the light scattering layer 180 from the organic emission layer 133 (see FIG. 1) may be emitted to the outside without being scattered after penetrating a region in which the barrier 1801 is not disposed among the top surface 170*a* of the base film 170 or the top surface 1801*a* of the barrier 1801 included in the light scattering layer 180.

That is, with respect to the light incident to the normal direction)(0°, as shown in FIG. 15, the emitted light is also concentrated on the normal direction)(0° or the light scattering layer 180. Although not illustrated, even when the barriers 1801 included in the light scattering layer 180 have different aspect ratios, the emitted light may be concentrated on the normal direction as illustrated in FIG. 15.

FIGS. 16A to 16E are graphs illustrating angle-dependent intensities of light that is incident to the oblique direction with respect to the normal direction and penetrates the light scattering layer 180 of FIG. 3, which includes the barriers 1801 having different aspect ratios.

FIGS. 16A to 16E illustrate angle-dependent intensities of light that is incident to the oblique direction inclined at about 45° with respect to the normal direction of the light scattering layer 180 and penetrates the light scattering layer 180 of FIG. 3, which includes the barriers 1801 having aspect ratios of 1:1, 1:3, 1:5, 1:7, and 1:10. Like the graph of FIG. 15, the graphs of FIGS. 16A to 16E are polar-coordinate graphs. An angle illustrated in the graphs represents an inclination degree of a viewing angle with respect to the normal direction along the horizontal direction of the organic light-emitting display apparatus 100 (see FIG. 1), and a distance from a center of a circle represents a luminescence intensity. A solid line and a dotted line of the graphs relights emitted from the organic light-emitting display apparatus 100 along the horizontal direction and the vertical direction, respectively.

Referring to FIGS. 3 and 16A to 16E, lights incident to the oblique direction inclined at about 45° with respect to the normal direction of the light scattering layer 180 are not emitted in the same direction, but are emitted in several directions by the light scattering pattern 1801*c* disposed at the side surface 1801*b* of the barrier 1801.

As shown in the graphs of FIGS. 16A to 16E, by changing the aspect ratio of the barrier 1801, the angle and intensity of the emitted light may be controlled, and a light scattering effect may occur in various aspect ratios.

As described above, according to one or more exemplary embodiments of the invention, the organic light-emitting display apparatuses including a light scattering layer disposed on a light emission surface of a substrate may reduce a color shift that may occur at a side viewing angle.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the invention have been described with reference to the figures, it will be understood by those of ordinary skill in the art that various changes in form and details may be made therein without departing from the spirit and scope of the invention as defined by the following claims.

What is claimed is:

1. An organic light-emitting display apparatus comprising: a substrate; an organic light-emitting device comprising: a first electrode disposed on the substrate; a second electrode disposed opposite to the first electrode; and an intermediate layer comprising an organic emission layer and disposed between the first electrode and the second electrode; and a light scattering layer disposed on at least one of the first electrode and the second electrode disposed in a light emission direction, wherein the light scattering layer comprises: a plurality of barriers each spaced apart from each other on a same surface, wherein each of the barriers is transparent allowing light to be transmitted therethrough; and a light scattering pattern on an exposed side surface of each of the plurality of barriers.

2. The organic light-emitting display apparatus of claim 1, wherein each of the plurality of barriers is disposed to extend substantially in a first direction, and the plurality of barriers is disposed substantially parallel to each other.

3. The organic light-emitting display apparatus of claim 1, wherein a top surface of each of the plurality of barriers is substantially parallel to the substrate.

4. The organic light-emitting display apparatus of claim 3, wherein the side surface defining each of the plurality of barriers is inclined at an angle in a range of about 45° to about 90° with respect to the substrate.

5. The organic light-emitting display apparatus of claim 1, wherein a distance between the plurality of barriers is in a range of about 1 micrometer to about 100 micrometers.

6. The organic light-emitting display apparatus of claim 1, wherein distances between the plurality of barriers are different from each other.

7. The organic light-emitting display apparatus of claim 1, wherein the plurality of barriers are divided into a first barrier portion and a second barrier portion, which are disposed in a same plane, each of the barriers in the first barrier portion is disposed to extend substantially in a first direction, and each of the barriers in the second barrier portion is disposed to extend substantially in a second direction, which is perpendicular to the first direction.

8. The organic light-emitting display apparatus of claim 1, wherein the light scattering layer comprises a first light scattering layer and a second light scattering layer, which are sequentially disposed on at least one of the first electrode and the second electrode disposed in the light emission direction, the barriers of the first light scattering layer extend substantially in a first direction, and the barriers of the second light scattering layer extend substantially in a second direction, which is perpendicular to the first direction.

9. The organic light-emitting display apparatus of claim 1, wherein the light scattering pattern has a lenticular configuration.

10. The organic light-emitting display apparatus of claim 1, wherein the light scattering pattern comprises a plurality of hemispherical projections.

11. The organic light-emitting display apparatus of claim 10, wherein a diameter of the plurality of projections is in a range of about 1 micrometer to about 100 micrometers.

12. The organic light-emitting display apparatus of claim 1, wherein the light scattering pattern comprises recesses and protrusions which are irregularly disposed.

13. The organic light-emitting display apparatus of claim 12, wherein a surface roughness of the light scattering pattern is in a range of about 0.1 micrometer to about 50 micrometers.

14. The organic light-emitting display apparatus of claim 1, further comprising:

a base film which supports the light scattering layer.

15. The organic light-emitting display apparatus of claim 14, wherein the light scattering layer is disposed on a light emission surface of the base film.

16. The organic light-emitting display apparatus of claim 15, further comprising:

an optical member disposed on a surface of the base film, which is opposite to the light emission surface of the base film.

17. The organic light-emitting display apparatus of claim 1, wherein at least one of the first electrode and the second electrode comprises a semitransparent layer.

18. The organic light-emitting display apparatus of claim 1, wherein the intermediate layer further comprises a cavity distance control layer configured to define a distance between the first electrode and the second electrode.

19. The organic light-emitting display apparatus of claim 1, wherein the light scattering pattern includes a plurality of semicylindrical convex portions which are consecutively disposed defining the exposed side surface of each of the plurality of barriers and emit light to the outside in several directions.

20. The organic light-emitting display apparatus of claim 1, wherein the light scattering pattern includes at least one of recesses and protrusions that are at least one of irregularly or non-uniformly disposed.

* * * * *